United States Patent [19]
Kim et al.

[11] Patent Number: 6,096,622
[45] Date of Patent: Aug. 1, 2000

[54] METHOD OF FORMING SHALLOW TRENCH ISOLATION OF SEMICONDUCTOR DEVICE

[75] Inventors: Chang Gyu Kim, Kyoungki-do; Moon Youn Jung, Seoul, both of Rep. of Korea

[73] Assignee: Dongbu Electronics Co., Ltd., Rep. of Korea

[21] Appl. No.: 09/384,893

[22] Filed: Aug. 27, 1999

[30] Foreign Application Priority Data

Aug. 27, 1998 [KR] Rep. of Korea ................ 98-34912

[51] Int. Cl.[7] .................................................. H01L 21/76
[52] U.S. Cl. ...................... 438/424; 438/427; 438/435; 438/437
[58] Field of Search .................................. 438/424, 425, 438/426, 427, 435, 437

[56] References Cited

U.S. PATENT DOCUMENTS

| | | |
|---|---|---|
| 5,492,858 | 2/1996 | Bose et al. . |
| 5,563,091 | 10/1996 | Lee . |
| 5,721,173 | 2/1998 | Yano et al. . |
| 5,858,858 | 1/1999 | Park et al. . |
| 5,904,538 | 5/1999 | Son et al. . |
| 5,913,132 | 6/1999 | Tsai . |
| 5,960,299 | 12/1999 | Yew et al. ............................... 438/424 |
| 6,008,108 | 12/1999 | Huang et al. ............................ 438/436 |

Primary Examiner—Trung Dang
Attorney, Agent, or Firm—Andrus, Sceales, Starke & Sawall

[57] ABSTRACT

The present invention discloses a method of a shallow trench isolation of a semiconductor device. The method comprises the steps of: forming a mask layer having a silicon layer on a semiconductor substrate; forming a trench mask pattern by etching a selected portion of the mask layer; forming a trench by etching the semiconductor substrate by using the trench mask pattern; forming an insulating layer for filling on the trench mask pattern so as to fill the trench; forming a crack in the insulating layer for filling formed on the trench mask pattern; removing a selected portion of the insulating layer for filling; and removing the trench mask pattern.

17 Claims, 7 Drawing Sheets

METHOD OF FORMING SHALLOW TRENCH ISOLATION OF SEMICONDUCTOR DEVICE

FIELD OF THE INVENTION

The present invention generally relates to a method of forming isolation region in a semiconductor device, and more particularly to a shallow trench isolation(hereinafter referred as to "STI") of semiconductor device.

BACKGROUND OF THE INVENTION

An STI technology has been studied so as to improve a LOCOS method that is widely used in manufacturing process of microelectronic devices. According to this STI technology, a semiconductor substrate is etched so that a shallow trench is formed therein, and an insulating material is filled in the shallow trench thereby forming an isolation region. If a conventional LOCOS method is used, the insulating material is formed by thermal oxidation for long time. However, if the conventional STI method is used, a thermal oxidation process is not required. Therefore, problems caused by the thermal oxidation process can be reduced by using the STI technology. For example, during the conventional LOCOS process, a bird's beak phenomenon which is formed at a boundary of an isolation region and an active region, can be reduced.

The conventional STI region is formed as follows.

First, a trench is formed in a semiconductor substrate. An insulating layer is deposited so as to fill inside the trench. The insulating layer is polished by a chemical vapor polishing("CMP") process until a surface of the semiconductor substrate is exposed, thereby filling the insulating layer within the trench.

However, there are problems in the conventional method of forming STI region. During the CMP process to the insulating layer until the surface of the semiconductor substrate is exposed, the insulating layer within the trench is removed faster than the insulating layer on the surface of the semiconductor substrate. Accordingly, a surface of the insulating layer within the trench is partially removed thereby occurring a dishing phenomenon.

Due to the dishing phenomenon, the surface of the semiconductor substrate is not planarized and the STI layer does not have sufficient insulating characteristic.

Accordingly, there have been suggested methods for preventing the dishing phenomenon at the surface of the insulating layer within the trench conventionally.

Referring to FIG. 1A, a pad oxide 12, a silicon nitride 14 are successively deposited on a semiconductor substrate 10. The pad oxide 12 is formed by a surface oxidation process and the silicon nitride 14 is formed by an LPCV or APCVD process.

Next, as shown in FIG. 1B, a trench mask 15 is formed by etching the silicon nitride 14 and the pad oxide 12 by a known photolithography process until a selected portion of the semiconductor substrate 10 is exposed. Herein, the exposed semiconductor substrate 10 is a region where a device isolation may be performed.

Referring to FIG. 1C, by using the trench mask 15, the exposed semiconductor substrate 10 is anisotropically etched by a selected depth thereby forming a trench T. Next, an insulating layer 16 with selected thickness capable of filling the trench T, is deposited on a resultant surface of the semiconductor substrate 10. At this time, an oxide film deposited according to the CVD process, for example, is used for the insulating layer 16. Herein, a recess r is formed in the insulating layer 16 formed at a portion of the trench T by a step difference of the trench T.

Afterward, referring to FIG. 1D, a polysilicon film 18 is formed on a surface of the insulating layer 16. The polysilicon film 18 serves for delaying the etch rate in the insulating layer 16 within the trench.

And then, a resultant surface of the semiconductor substrate 10 is washed. Continuously, the polysilicon film 18 is polished by the CMP process until a surface of the insulating layer 16 is exposed. As shown in FIG. 1E, then the polysilicon film 18 is filled in a recess r of the insulating layer 16. Herein, the polysilicon film 18 filled in the recess r, is called as a mask polysilicon 18a.

Next, the surface of the insulating layer 16 is washed so that remaining slurry and other contaminants are removed. As shown in FIG. 1F, the insulating layer 16 and the mask polysilicon 18a are etched-back by a selected thickness. Herein, the insulating layer 16 covered with the mask polysilicon 18a is not etched-back relatively due to the difference of etch rate between the polysilicon and the insulating layer. Accordingly, the insulating layer 16 at the trench portion T is relatively protruded to the upside.

Referring to FIG. 1G, the insulating layer 16 is polished according to the CMP process until a surface of the silicon nitride 14 is exposed. Herein, although the CMP process is performed, there is occurred no dishing phenomenon at an upper part of the insulating layer 16 within the trench T since the insulating layer 16 within the trench T is relatively thicker than the insulating layer on the silicon nitride 14.

Referring to FIG. 1H, the silicon nitride 14 and the pad oxide 12 are removed by a known method, thereby forming an STI 18 incurring no dishing phenomenon.

However, the conventional method of forming the STI requires a number of processing steps such as steps of etching trenches; forming oxide and polysilicon films; polishing the polysilicon film by the CMP method; etching-back the oxide film; and polishing the oxide film by the CMP method.

Especially, this method required two times of CMP processes, and the manufacturing process thereof is complicated thereby degrading productivity.

SUMMARY OF THE INVENTION

Accordingly, the present invention is directed to provide a method of forming an STI of a semiconductor device capable of preventing the dishing phenomenon and simplifying manufacturing processes.

To accomplish the foregoing object, the present invention includes the steps of: forming a mask layer having a silicon layer on a semiconductor substrate; forming a trench mask pattern by etching a selected portion of the mask layer; forming a trench by etching the semiconductor substrate by using the trench mask pattern; forming an insulating layer for filling on the trench mask pattern so as to fill the trench; forming a crack in the insulating layer for filling formed on the trench mask pattern; removing a selected portion of the insulating layer for filling; and removing the trench mask pattern.

The present invention further includes the steps of: depositing a pad oxide, a silicon nitride on a semiconductor substrate successively; forming a silicon layer on the silicon nitride; forming an insulating layer on the silicon layer; forming a trench mask pattern by partially etching the insulating layer, the silicon layer, the silicon nitride and the pad oxide; forming a trench by etching a selected depth of the semiconductor substrate by using a trench mask pattern; forming an insulating layer for filling on the insulating layer for filling so as to fill the trench; forming a crack in a selected portion of the insulating layer for filling by laser-annealing the trench mask pattern; removing a selected thickness of the insulating layer for filling and the insulating layer; and removing remaining trench mask pattern.

DETAILED DESCRIPTION OF THE PREFERRED EMBODIMENT

Hereinafter, the preferred embodiment of the present invention will be described.

Figure 1A:
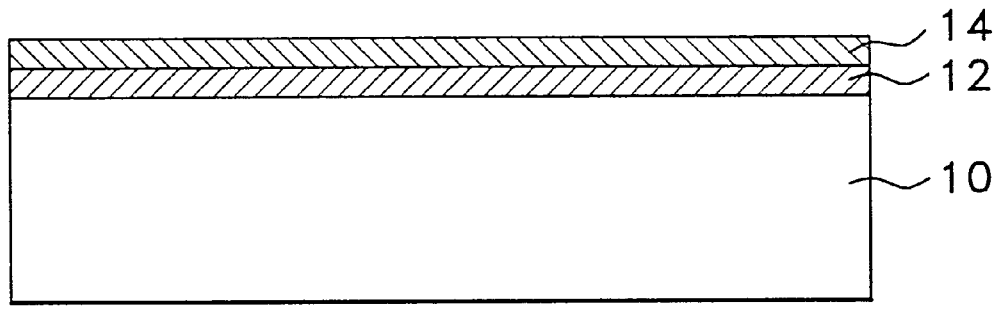
FIGS. 1A to 1H are cross-sectional views showing a conventional method of forming an STI of a semiconductor device.
Figure 1B:
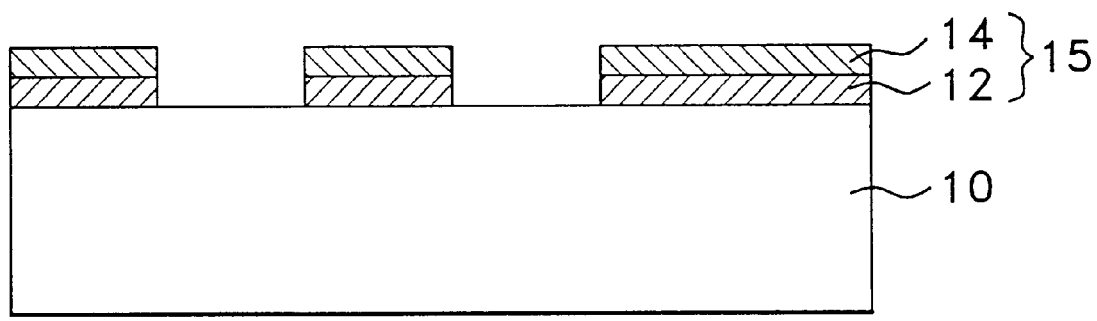
Figure 1C:
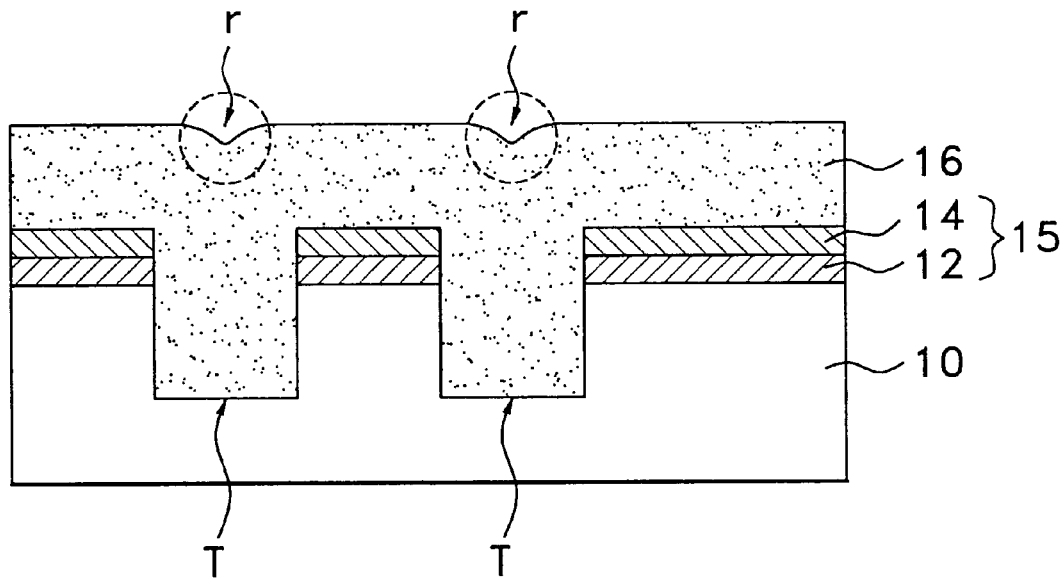
Figure 1D:
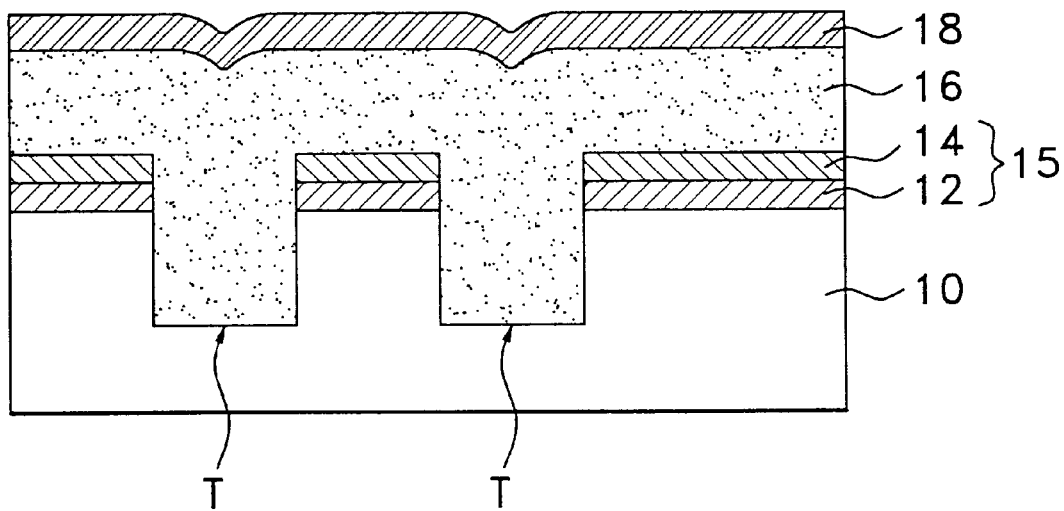
Figure 1E:
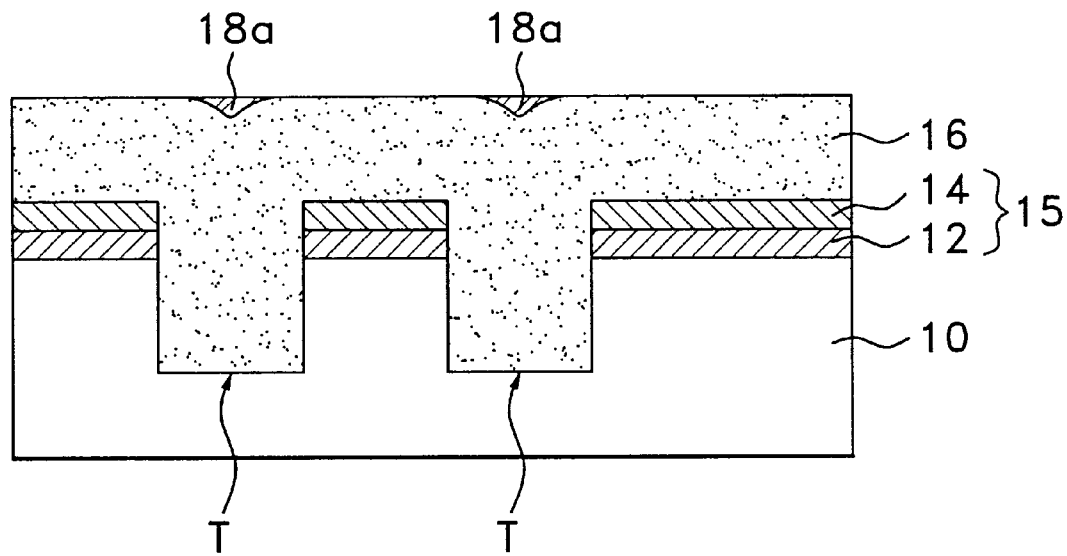
Figure 1F:
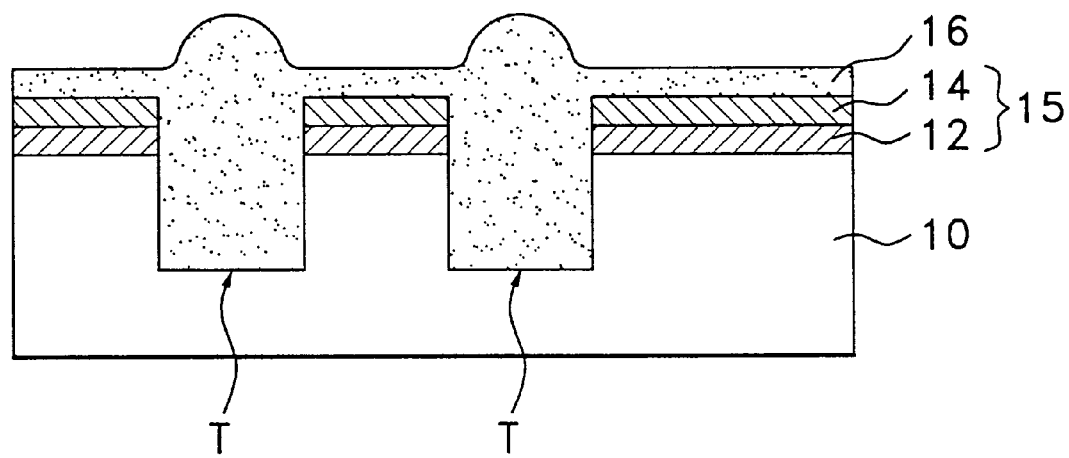
Figure 1G:
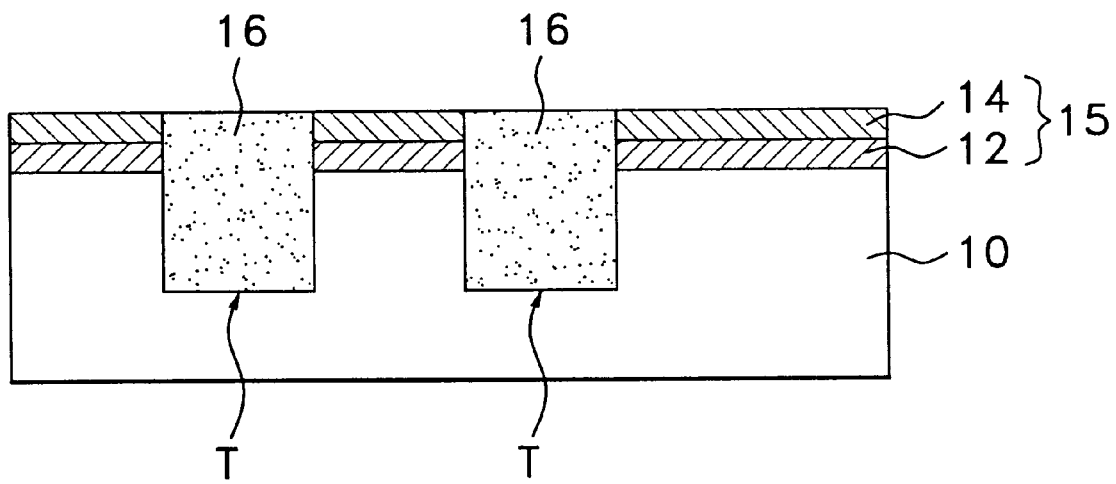
Figure 1H:
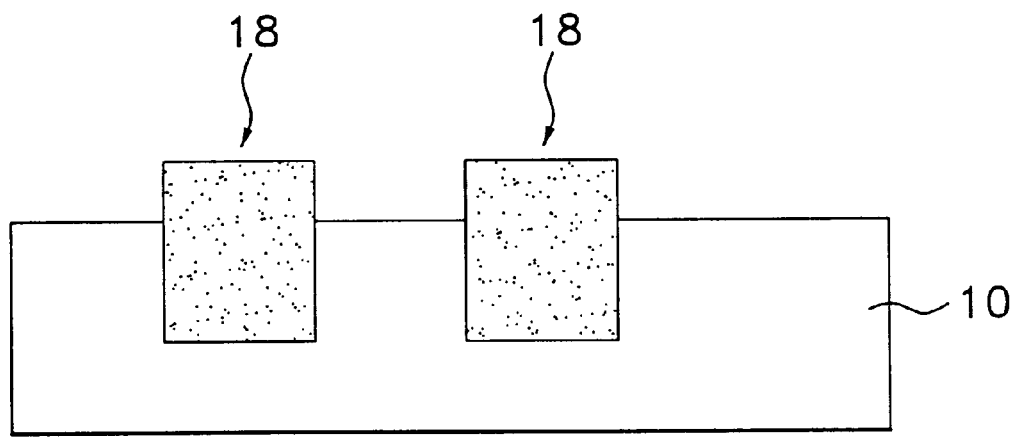
Figure 2A:
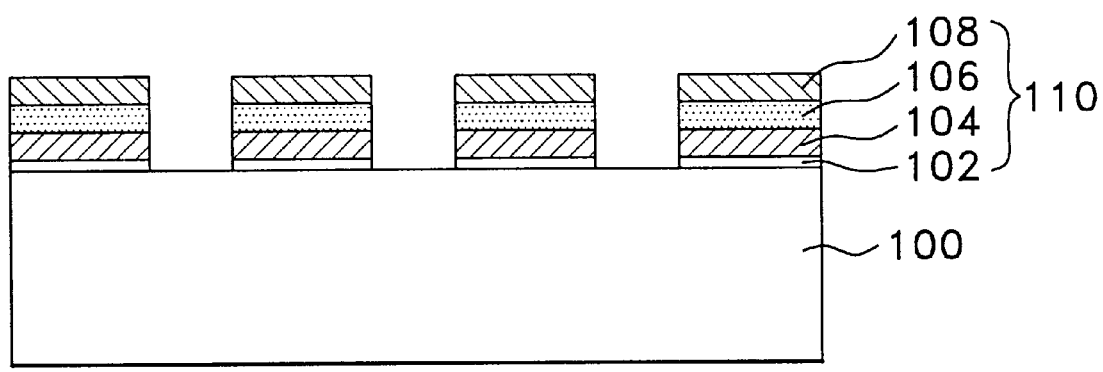
FIGS. 2A to 2E are cross-sectional views showing a method of forming an STI of a semiconductor device according to the present invention.

Referring to FIG. 2A, a pad oxide 102 is formed on a semiconductor substrate 100 by a thickness of several-dozen Å to several-hundred Å according to a thermal oxidation process. A silicon nitride 104 is deposited on the pad oxide 102. A silicon layer 106 is deposited on the silicon nitride 104. Herein, the silicon nitride 106 is formed by a chemical vapor deposition(CVD) method and an amorphous silicon or polysilicon can be used for example. And then, an insulating layer 108 is formed on the silicon layer 106.

Continuously, according to a known photolithography method, a resist pattern(not shown) for forming a trench is formed on the insulating layer 108. Next, the exposed insulating layer 108, the silicon layer 106, the silicon nitride 104 and the pad oxide 102 are etched by using the resist pattern as a mask, thereby forming a trench mask pattern 110. Afterward, the resist pattern is removed by a known method. At this time, the trench mask pattern 110 can be formed only with the insulating layer 108, the silicon layer 106 and the pad oxide 102.

Figure 2B:
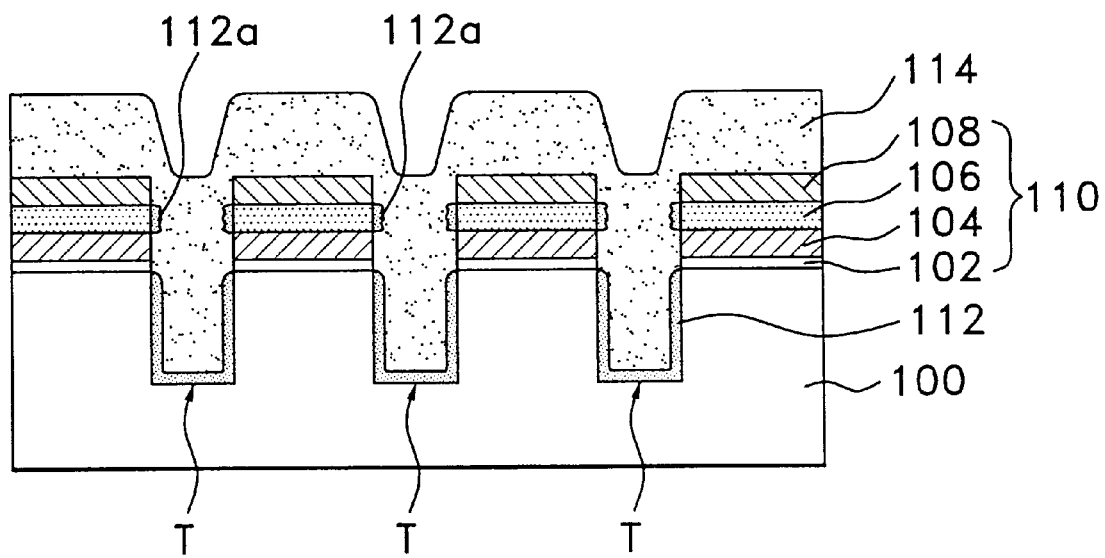

Next, referring to FIG. 2B, the exposed semiconductor substrate 100 is etched by a selected depth by using the trench mask pattern 110, thereby forming a trench T. Afterward, a spacer 112 is formed by thermally growing outer surface of the trench T so as to recover inner walls of the trench T from damages. At this time, a spacer 112a is also formed at both sidewalls of the silicon layer 106 by thermally growing the exposed silicon layer 106. And then, an insulating layer 114 for filling is formed on a resultant surface of the semiconductor substrate 100 so that inside of the trench T is sufficiently filled. Herein, a high density plasma("HDP") oxide film or a tetraothorsilicate-undoped silicate glass("TEOS-USG") oxide film can be used for the insulating layer 114 for filling.

Figure 2C:
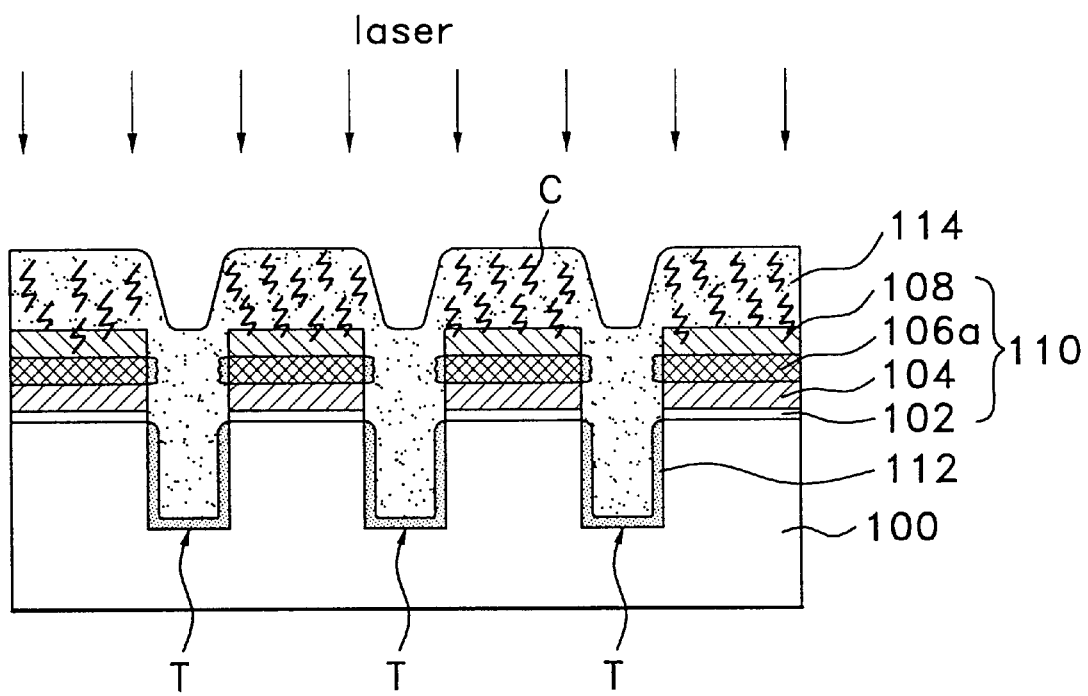

Next, as shown in FIG. 2c, the resultant of the semiconductor substrate 100 is annealed by radiating a laser beam thereto. According to the annealing step by radiating the laser beam, the silicon layer 106 made of an amorphous silicon or a polysilicon is crystallized. The reference numeral 106a in the drawing, stands for the crystallized silicon layer. When the silicon layer 106 is under crystallization process, a grain boundary at a surface of the silicon layer 106 is expanded, and therefore stress is applied to the insulating layer 114 for filling formed on the upper part of the silicon layer 106a. Consequently, there are occurred minute cracks C on the insulating layer 114 for filling and on the insulating layer 108. Herein, density and size of cracks are adjustable depend on the thickness of silicon layer 106, the thickness of the insulating layer 114 for filling and conditions of the laser annealing process. In addition, a laser beam having wave of 183 to 308 nm is used for the laser beam used in the laser annealing process. At this time, an interfacial defect between the substrate portion in the trench T and the insulating layer is recovered by the laser annealing process.

Figure 2D:
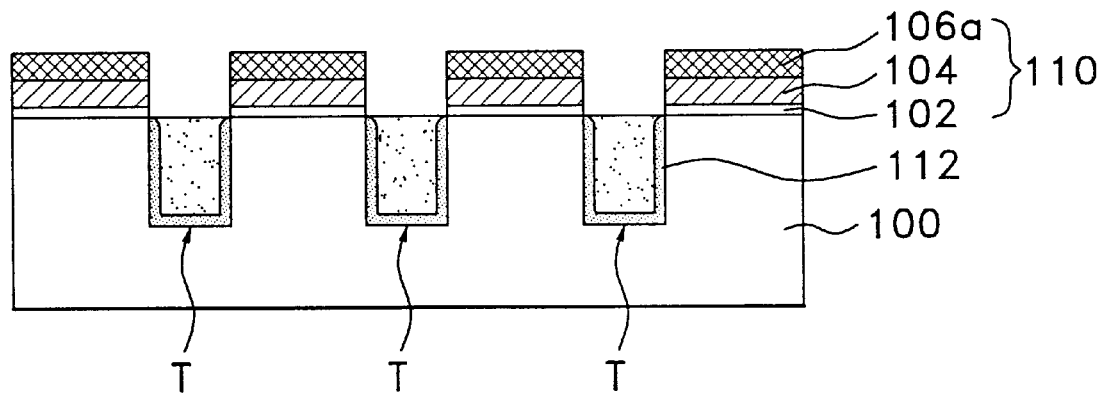

Next, as shown in FIG. 2D, the insulating layer 114 for filling and the insulating layer 108 are wet-etched. Herein, it is easy for a wet-etching solution to penetrate into the cracks. Accordingly, the insulating layer 114 for filling and the insulating layer 108 in which cracks are occurred, are etched faster than the same in which no cracks are occurred. Therefore, although all the insulating layer 114 for filling formed on the insulating layer 108 is removed, the insulating layer 114 for filling formed in the trench T is removed by a selected thickness. Herein, since the insulating layer 114 for filling and the silicon layer 106 have excellent etching selectivity, surfaces of the silicon layer 106 and the semiconductor substrate 100 can be set in the same plane by adjusting the wet-etching time.

Figure 2E:
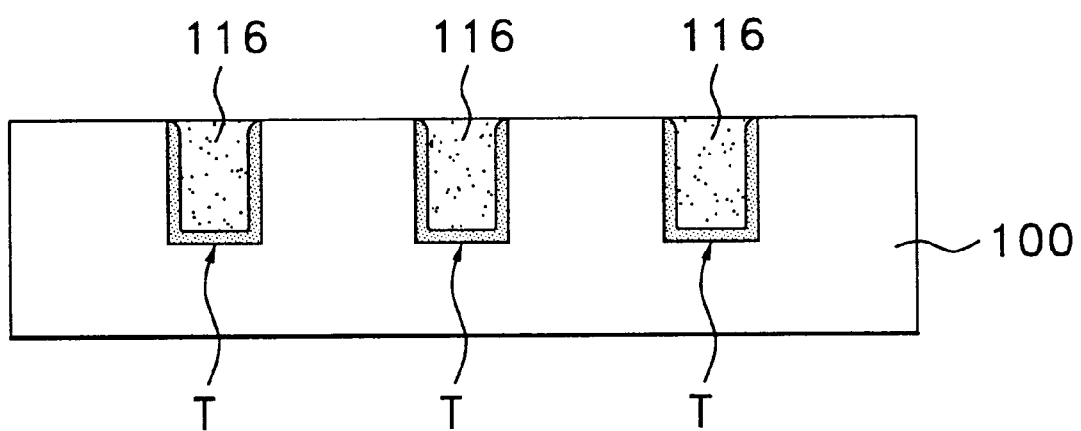

Thereafter, as shown in FIG. 2E, the silicon layer 106, the silicon nitride 104 and the pad oxide 102 are removed by the wet-etching or a dry-etching process, thereby forming an STI 116 within the semiconductor 100.

As disclosed in the above description, according to the present invention, a trench mask having a silicon layer is formed. By the trench mask, a trench is formed and then an insulating layer for filling is formed so as to fill the trench. Afterward, the trench mask is crystallized by a laser annealing process. Then, artificial cracks are formed at the insulating layer for filling formed on the trench mask. Afterward, during the wet-etching process, the insulating layer for filling in which cracks are formed therein is rapidly removed thereby filling the insulating layer inside the trench easily. At this time, there are formed no cracks in the insulating layer for filling formed in the trench and dishing is nor occurred.

Further, according to the present invention, no extra CMP process is not required when an insulating layer for filling is filled within the trench additionally. Therefore, forming process is simplified and damages occurred by the CMP process can be decreased.

Moreover, the interfacial defect between the semiconductor substrate and the insulating layer is reduced by the laser crystallizing process. Therefore, a leakage current is prevented.

Although preferred embodiment of the present invention is described and illustrated, various other modifications will be apparent to and can be readily made by those skilled in the art without departing from the scope and spirit of the present invention.

What is claimed is:

1. A method of forming a shallow trench isolation(STI) of a semiconductor device comprising the steps of:

forming a mask layer having a silicon layer on a semiconductor substrate;

forming a trench mask pattern by etching a selected portion of the mask layer;

forming a trench by etching the semiconductor substrate by using the trench mask pattern;

forming an insulating layer for filling on the trench mask pattern so as to fill the trench;

forming a crack in the insulating layer for filling formed on the trench mask pattern;

removing a selected portion of the insulating layer for filling; and removing the trench mask pattern.

2. The method of claim 1, wherein the step of forming the mask layer further comprises the steps of:

forming a pad oxide on the semiconductor substrate;

forming a silicon nitride on the pad oxide;

forming a silicon layer on the silicon nitride; and forming an insulating layer on the silicon layer.

3. The method of claim 2, wherein the silicon layer is an amorphous silicon layer or a polysilicon layer.

4. The method of claim 1, wherein the crack in the insulating layer for filling formed on the trench mask pattern, is formed by crystallizing the silicon layer within the trench mask pattern.

5. The method of claim 4, wherein the silicon layer is crystallized by a laser annealing process.

6. The method of claim 5, wherein a laser beam having wave length of 183 to 308 nm is used for the laser beam used in the laser annealing process.

7. The method of claim 1, wherein a high density plasma ("HDP") oxide film or a tetraothorsilicate-undoped silicate glass("TEOS-USG") oxide film is used for the insulating layer for filling.

8. The method of claim 1, wherein a selected portion of the insulating layer for filling is removed by a wet-etching or a dry etching process.

9. The method of claim 8, wherein the insulating layer for filling is wet-etched until height of the insulating layer for filling is coincided with that of a surface of the semiconductor substrate.

10. The method of claim 1, further comprising the step of forming a spacer on a surface of the trench by thermally growing so as to recover interfacial defects on the surface of the trench, between the steps of forming the trench and forming the insulating layer for filling.

11. A method of forming an STI of a semiconductor device comprising the steps of:

depositing a pad oxide, a silicon nitride on a semiconductor substrate successively;

forming a silicon layer on the silicon nitride;

forming an insulating layer on the silicon layer;

forming a trench mask pattern by partially etching the insulating layer, the silicon layer, the silicon nitride and the pad oxide;

forming a trench by etching a selected depth of the semiconductor substrate by using a trench mask pattern;

forming an insulating layer for filling on the insulating layer for filling so as to fill the trench;

forming a crack in a selected portion of the insulating layer for filling by laser-annealing the trench mask pattern;

removing a selected thickness of the insulating layer for filling and the insulating layer; and removing remaining trench mask pattern.

12. The method of claim 11, wherein the silicon layer is an amorphous silicon layer or a polysilicon layer.

13. The method of claim 11, wherein a laser beam having wave length of 183 to 308 nm is used for the laser beam used in the laser annealing process.

14. The method of claim 11, wherein a high density plasma("HDP") oxide film or a tetraothorsilicate-undoped silicate glass("TEOS-USG") oxide film is used for the insulating layer for filling.

15. The method of claim 11, wherein a selected portion of the insulating layer for filling is removed by a wet-etching or a dry etching process.

16. The method of claim 15, wherein the insulating layer for filling is wet-etched until height of the insulating layer for filling is coincided with that of a surface of the semiconductor substrate.

17. The method of claim 11, further comprising the step of forming a spacer on a surface of the trench by thermally growing so as to recover interfacial defects on the surface of the trench, between the steps of forming the trench and forming the insulating layer for filling.

* * * * *